United States Patent
Siles Perez et al.

(10) Patent No.: US 12,087,867 B2
(45) Date of Patent: Sep. 10, 2024

(54) ON-CHIP DIPLEXED MULTI-BAND SUBMILLIMETER-WAVE/TERAHERTZ SOURCES

(71) Applicant: California Institute of Technology, Pasadena, CA (US)

(72) Inventors: Jose Vicente Siles Perez, Pasadena, CA (US); Choonsup Lee, La Palma, CA (US); Robert H. Lin, Chino, CA (US); Alejandro Peralta, Pasadena, CA (US)

(73) Assignee: CALIFORNIA INSTITUTE OF TECHNOLOGY, Pasadena, CA (US)

(*) Notice: Subject to any disclaimer, the term of this patent is extended or adjusted under 35 U.S.C. 154(b) by 777 days.

(21) Appl. No.: 17/093,305

(22) Filed: Nov. 9, 2020

(65) Prior Publication Data
US 2021/0218368 A1 Jul. 15, 2021

Related U.S. Application Data

(60) Provisional application No. 62/931,937, filed on Nov. 7, 2019.

(51) Int. Cl.
*H01L 29/872* (2006.01)
*H01L 23/66* (2006.01)
*H03B 19/06* (2006.01)

(52) U.S. Cl.
CPC ............ *H01L 29/872* (2013.01); *H01L 23/66* (2013.01); *H03B 19/06* (2013.01); *H01L 2223/6627* (2013.01); *H01L 2223/6688* (2013.01)

(58) Field of Classification Search
CPC .............. H01L 29/872; H01L 23/66; H01L 2223/6627; H01L 2223/6688; H03B 19/16
See application file for complete search history.

(56) References Cited

U.S. PATENT DOCUMENTS

6,476,692 B2 11/2002 Uchino
6,998,941 B2 2/2006 Maltsev et al.
(Continued)

FOREIGN PATENT DOCUMENTS

CN 115295630 A * 11/2022

OTHER PUBLICATIONS

Song, H-J., et al., "Present and Future of Terahertz Communications", IEEE Transactions on Terahertz Science and Technology, Sep. 2011, pp. 256-263, vol. 1., No. 1.
(Continued)

*Primary Examiner* — Adam D Houston
(74) *Attorney, Agent, or Firm* — Gates & Cooper LLP

(57) ABSTRACT

A solid-state device chip including diodes (generating a higher or lower frequency output through frequency multiplication or mixing of the input frequency) and a novel on-chip diplexing design that allows combination of two or more multiplier or mixer structures operating at different frequency bands within the 50-5000 GHz range within a same chip and/or waveguide. The on-chip diplexing design consists of a single-substrate multiplier chip with two or more multiplying structures each one containing 2 or more Schottky diodes. The diodes in each structure are tuned to one portion of the target frequency band, resulting in the two or more structures working together as a whole as a large broadband multiplier or mixer. Thus, an increase in bandwidth from 10-15% (current state-of-the-art) to at least 40% is achieved. Depending on the target frequencies, each subset of diodes within the chip can be designed to work either as a doubler or a tripler.

19 Claims, 11 Drawing Sheets

(56) References Cited

U.S. PATENT DOCUMENTS

| | | | |
|---|---|---|---|
| 8,159,208 B2* | 4/2012 | Brown | H01P 1/2135 |
| | | | 324/76.23 |
| 8,466,832 B2 | 6/2013 | Afshari et al. | |
| 8,680,898 B2 | 3/2014 | Tsukashima | |
| 8,686,813 B2* | 4/2014 | Deal | H01L 23/66 |
| | | | 333/248 |
| 8,841,944 B1 | 9/2014 | Lee et al. | |
| 9,143,084 B2 | 9/2015 | Siles Perez et al. | |
| 10,075,151 B2* | 9/2018 | Siles Perez | H03B 19/18 |
| 2007/0139135 A1 | 6/2007 | Ammar et al. | |
| 2010/0295630 A1* | 11/2010 | Itoh | H01P 1/2135 |
| | | | 333/117 |
| 2011/0248791 A1* | 10/2011 | Dupuy | H01P 1/15 |
| | | | 333/136 |
| 2013/0229210 A1 | 9/2013 | Siles et al. | |
| 2014/0268174 A1* | 9/2014 | Sabry | G01J 1/0411 |
| | | | 356/519 |
| 2021/0218368 A1* | 7/2021 | Siles Perez | H01L 29/872 |
| 2022/0407200 A1* | 12/2022 | Chattopadhyay | H04B 1/04 |
| 2023/0027356 A1* | 1/2023 | Chattopadhyay | H01P 1/122 |

OTHER PUBLICATIONS

Cooper, K.B., et al., "THz Imaging Radar for Standoff Personnel Screening", IEEE Transactions on Terahertz Science and Technology, Sep. 2011, pp. 169-182, vol. 1, No. 1.

Chattopadhyay, G., "Technology, Capabilities, and Performance of Low Power Terahertz Sources", IEEE Transactions on Terahertz Science and Technology, Sep. 2011, pp. 33-53, vol. 1., No. 1.

Ferber, R.R., et al., "W Band MMIC Power Amplifiers for the Herschel HIFI Instrument", Proc. of 14th International Symposium on Space THz Technology, Apr. 2003, pp. 73-82.

Siles, J.V., et al., "Design of a High-Power 1.6 THz Schottky Tripler Using 'On-chip' Power-Combining and Silicon Micromachining", In Proc. of 22nd International Symposium on Space THz Technology, Apr. 2011, pp. 1-4.

Thomas, B., et al., "W-band balanced frequency tripler using a novel coupled lines biasing scheme compatible with filip-chip mounting", In Proc. of 23rd International Symposium on Space THz Technology, Apr. 2012, pp. 1-3.

Vukusic, J., et al., "High Power W-band Monolithically Integrated Tripler", In Proc. of 34th International Conference on Infrared, Millimeter and THz Waves, Sep. 2009, pp. 1-2.

Maestrini, A., et al., "In-Phase Power-Combined Frequency Triplers at 300 GHz", IEEE Microwave and Wireless Components Letters, Mar. 2008, pp. 218-220, vol. 18, No. 3.

Maestrini, A., et al., "A 540-640-GHz High-Efficiency Four-Anode Frequency Tripler", IEEE Transactions on Microwave Theory and Techniques, Sep. 2005, pp. 2835-2843, vol. 53, No. 9.

Radisic, V., et al., "A 50 mW 220 GHz Power Amplifier Module", IEEE MTT-S Int. Microwave Symp. Dig., Jun. 2010, pp. 45-48.

Virginia Diodes, Inc., "High-Efficiency 94 GHz Frequency Tripler Development at VDI," Company newsletters, Feb. 2008, http://vadiodes.com/VDI/pdf.

Siles, J.V., et al., "A High-Power 105-120 GHz Broadband On-Chip Power-Combined Frequency Tripler", IEEE Microwave and Wireless Components Letters, Mar. 2015, pp. 157-159, vol. 25, No. 3.

HRL Laboratories LLC., http://mmics.hrl.com, downloaded Apr. 20, 2016.

Millitech Inc., http://www.millitech.com, downloaded Apr. 20, 2016.

Siles, J.V., et al., "Single-Waveguide Power-Combined Multipliers for Next Generation LO Sources Above 100 GHz", Proceedings of the 5th European Microwave Integrated Circuits Conference, Sep. 27-28, 2010, Paris, France, pp. 234-237.

Maestrini et al., "Schottky diode-based terahertz frequency multipliers and mixers", Terahertz electronic and optoelectronic components and systems, 2010, Academie des sciences. Published by Elsevier Masson SAS, pp. 480-495.

Lee, Y., et al., "High-Efficiency W-Band GaAs Monolithic Frequency Multipliers", IEEE Transactions on Microwave Theory and Techniques, vol. 52, No. 2, Feb. 2004, pp. 529-535.

Hrobak et al. "Planar Varistor Mode Schottky Diode Frequency Tripler Covering 60 GHz to 11 O GHz", 2013 IEEE MTT-S International Microwave Symposium Digest (MTT), pp. 1-4.

Maestrini et al., "A Frequency-Multiplied Source With More Than 1mW of Power Across The 840-900-GHz Band", IEEE Trans. on Microwave Theory and tech., vol. 58, No. 7, pp. 1925-1931, Jul. 2007.

Mehdi et al., "High-power local oscillator sources for 1-2 THz", in Proc. SPIE, 7741, 774112, 2010.

Chattopadhyay et al., "Development of Multi-Pixel Heterodyne Array Instruments at Submillimeter Wavelengths", Proc. of the Asia Pacific Micro. Conf., Dec. 2004.

Siles et al., "A Single-Waveguide In-Phase Power-Combined Frequency Doubler at 190 GHz", IEEE Microwave and Wireless Components Letters, vol. 21, No. 6, pp. 332-334, Jun. 2011.

Jung et al., "Silicon Micro-Machining Technology for THz Applications", 35th Int. Conf. on Infrared, Millimeter and Terahertz waves, Sep. 2010.

Mehdi, I., et al., "THz Diode Technology: Status, Prospects, and Applications", Proceedings of the IEEE, Jun. 2017, pp. 990-1007, vol. 105, No. 6.

Song, H., et al., "Present and Future of Terahertz Communications", IEEE Transactions on Terahertz Science and Technology, Sep. 2011, pp. 256-263, vol. 1, No. 1.

Akyildiz, I.F., et al., "Terahertz band: Next frontier for wireless communications", Physical Communication, 2014, pp. 16-32, vol. 12.

Siles, J.V., et al., "A New Generation of Room-Temperature Frequency-Multiplied Sources With up to 10× Higher Output Power in the 160-GHz—1.6-THz Range", IEEE Transactions on Terahertz Science and Technology, Nov. 2018, pp. 596-604, vol. 8, No. 6.

"Commercial MMIC Products", HRL Laboratories LLC., pp. 1-4, http://mmics.hrl.com, as downloaded May 11, 2021.

Millitech Inc., http://www.millitech.com, pp. 1-2, as downloaded Apr. 20, 2016.

Ferber, R.R., et al., "W Band MMIC Power Amplifiers for the Herschel HIFI Instrument", 14th International Symposium on Space Terahertz Technology, Apr. 2003, pp. 73-82.

"Teledyne Scientific V-, W-, D-, and G-band PA's", Teledyne Scientific and Imaging, pp. 1-2, http://www.teledynesi.com/products/Documents/Teledyne_SSPA_brochure_Mar-2020.pdf, Mar. 2020, as downloaded May 11, 2021.

De Graauw, T., et al., "The Herschel-Heterodyne Instrument for the Far-Infrared (HIFI)", Astronomy and Astrophysics, Jul. 2010, pp. 579-580.

Wiedner, M.C., et al., "A Proposed Heterodyne Receiver for the Origins Space Telescope", IEEE Transactions on Terahertz Science and Technology, Nov. 2018, pp. 558-571, vol. 8, No. 6.

\* cited by examiner

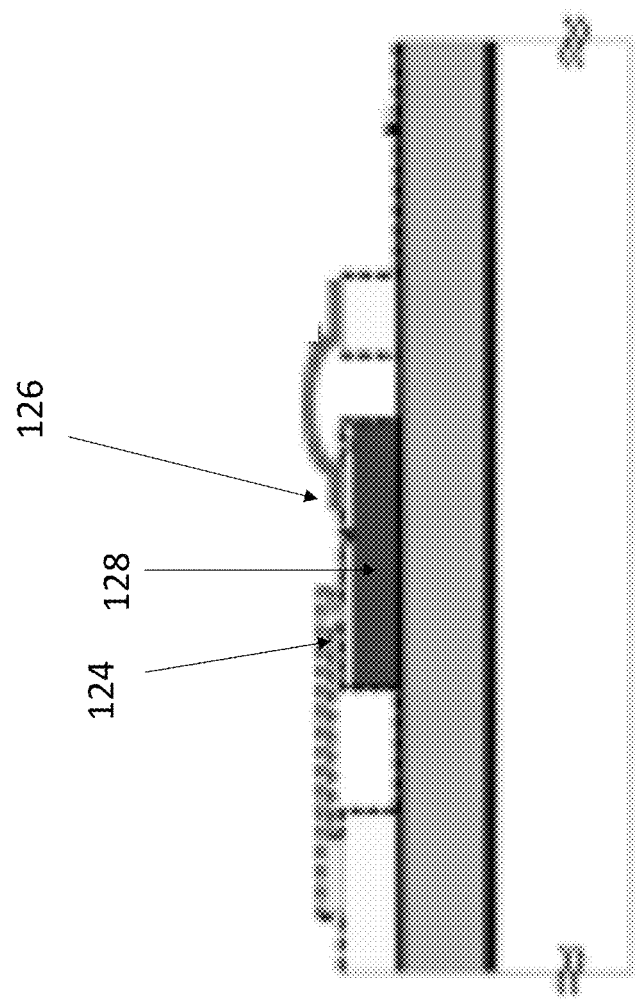
Fig. 1B
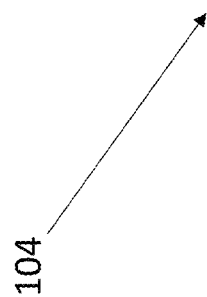

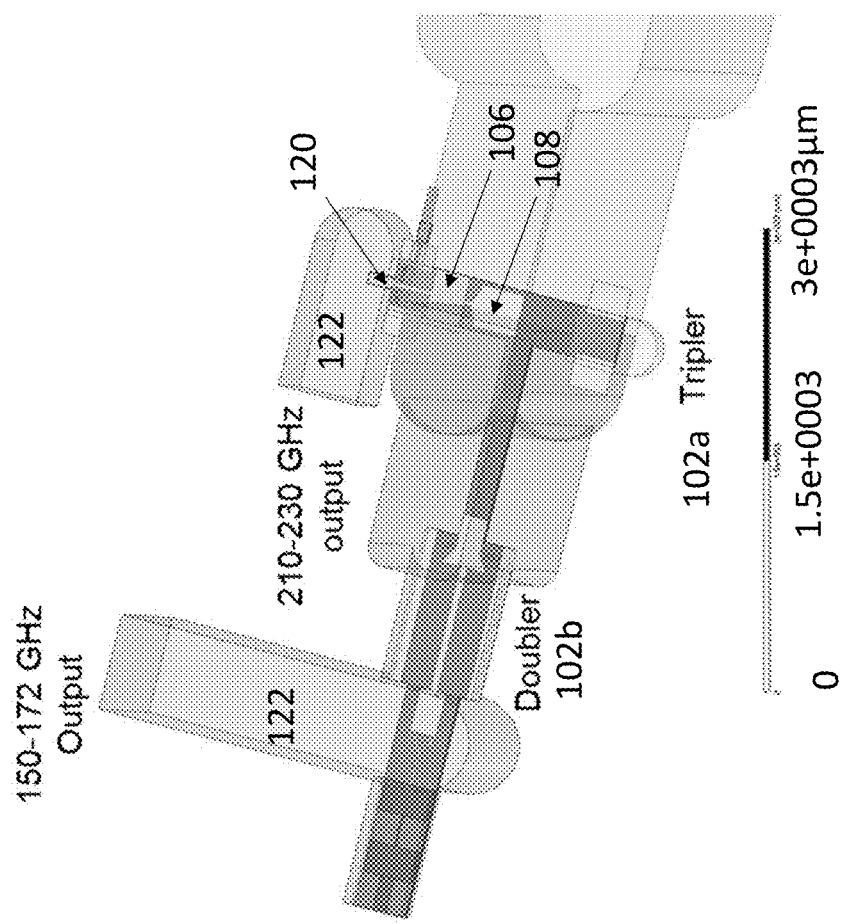

ON-CHIP DIPLEXED MULTI-BAND SUBMILLIMETER-WAVE/TERAHERTZ SOURCES

CROSS REFERENCE TO RELATED APPLICATIONS

This application claims the benefit under 35 U.S.C. Section 119(e) of co-pending and commonly-assigned U.S. Provisional Patent Application Ser. No. 62/931,937, filed on Nov. 7, 2019, by Jose Vicente Siles Perez, Choonsup Lee and Robert H. Lin, entitled "ON-CHIP DIPLEXED MULTI-BAND SUBMILLIMETER-WAVE/TERAHERTZ SOURCES," (CIT-8386); which application is incorporated by reference herein.

This application is related to U.S. Utility patent application Ser. No. 13/595,964, filed on Aug. 27, 2012, now U.S. Pat. No. 9,143,084, issued Sep. 22, 2015, by Jose Vicente Siles Perez, Goutam Chattopadhyay, Choonsup Lee, Erich T. Schlecht, Cecile D. Jung-Kubiak, and Imran Mehdi, entitled "ON-CHIP POWER-COMBINING FOR HIGH-POWER SCHOTTKY DIODE BASED FREQUENCY MULTIPLIERS,", which application claims the benefit under 35 U.S.C. Section 119(e) of U.S. Provisional Patent Application, No. 61/527,506, filed on Aug. 25, 2011, by Goutam Chattopadhyay, Imran Mehdi, Erich T. Schlecht, Choonsup Lee, Jose V. Siles, Alain E. Maestrini, Bertrand C. Thomas, Cecile D. Jung, entitled "ON-CHIP POWER-COMBINING FOR HIGH-POWER SCHOTTKY DIODE BASED FREQUENCY MULTIPLIERS,"; and U.S. Utility patent application Ser. No. 14/952,361, filed on Nov. 25, 2015, by Jose Vicente Siles Perez, Choonsup Lee, Goutam Chattopadhyay, Ken B. Cooper, Imran Mehdi, Robert H. Lin, and Alejandro Peralta, entitled "ULTRA-HIGH POWER W-BAND/F-BAND SCHOTTKY DIODE BASED FREQUENCY MULTIPLIERS,"; which application claims the benefit under 35 U.S.C. Section 119(e) of commonly-assigned U.S. Provisional Patent Application Ser. No. 62/931,937 No. 62/084,753, filed on Nov. 26, 2014, by Jose Vicente Siles Perez, Choonsup Lee, Goutam Chattopadhyay, Ken B. Cooper, Imran Mehdi, Robert H. Lin, and Alejandro Peralta, entitled "ULTRA-HIGH POWER W-BAND/F-BAND SCHOTTKY DIODE BASED FREQUENCY MULTIPLIERS,"; all of which applications are incorporated by reference herein.

STATEMENT REGARDING FEDERALLY SPONSORED RESEARCH AND DEVELOPMENT

This invention was made with government support under Grant No. 80NM0018D004 awarded by NASA (JPL). The government has certain rights in the invention.

BACKGROUND OF THE INVENTION

1. Field of the Invention

This invention relates to on-chip diplexing Schottky diode based frequency multipliers and mixers structures at a chip and waveguide level to combine two or more frequency bands of operation together on a single multiple millimeter/submillimeter-wave/terahertz local oscillator or receiver.

DESCRIPTION OF THE RELATED ART (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Broadband frequency multiplied local oscillator (LO) sources and frequency mixers in the millimeter-wave (30-300 GHz) and submillimeter-wave/terahertz range (300 GHz-5000 GHz) are in demand for a variety of applications. Most prominently, these LO sources can be used for far-infrared radio-astronomy, planetary science or Earth science receivers aimed to detect and analyze molecular emissions from star formation and protoplanetary disks, to map water vapor and perform composition analyses, to decipher the composition of planetary atmospheres, for Earth health monitoring, etc. [1]. Broadband frequency mixers based on the same technology are also used as part of these receivers. Broadband sources and mixer are also needed for high data-rate terahertz communications [2, 3] and in millimeter- and submillimeter wave radars or radiometers, which are being considered for security applications such as surveillance, mass transit security, and perimeter intrusion detection [4]. Reaching the highest possible bandwidth is critical for millimeter-submillimeter-wave and terahertz receivers. For astrophysics, planetary science and Earth science, broadband operations allows to detect multiple emission lines with one single receiver, enormously decreasing the volume, size, complexity, cost and power consumption of scientific instruments based on this technology. Frequency-multiplied Schottky diode sources are a preferred technology to generate relatively high power in the submillimeter-wave and terahertz ranges; see sources review in [5]. But with RF bandwidth operation in the 5-15% range, the bandwidth of Schottky based millimeter-submillimeter-wave and terahertz frequency multipliers and mixers are far from the operational limit, normally defined by the mono-modal waveguide operation (~40%). New concepts are needed to reach RF bandwidth operation beyond 30%.

Solid state amplifiers could be an alternative to Schottky diodes for broadband signal generation at high frequencies (100-1000 GHz) [6-9]. However, there are currently no commercially available amplifiers that extend beyond ~300 GHz range, and only Teledyne Scientific offers ultra-broadband InP multipliers in the millimeter-range up to ~250 GHz [10]). Waveguide based diplexers can be used to combine different frequency bands but they have limited capabilities due to the impossibility of overlapping two bands frequency bands without no gap in between. Moreover, waveguide diplexers are commercially available at millimeter-waves only, not at submillimeter-wave and terahertz ranges due to the complexity in machining and additional circuit losses connected with waveguide-based diplexers.

SUMMARY OF THE INVENTION

One or more embodiments of the invention disclose a solid-state device, comprising a chip including diodes (generating a higher frequency output through frequency-multiplication of the input frequency, or an intermediate frequency by frequency mixing of a local oscillator and a RF signal) and a novel on-chip power diplexing technique. The on-chip diplexing concept for frequency multipliers and mixers increases the operation RF bandwidth up to a factor of three compared to traditional multipliers and mixers.

In various examples, the diodes' GaAs heterostructure and the overall chip geometry are designed to be optimized for ultra broad band operation. As a result of all these features, the solid state device can generate record-setting RF bandwidth at a signal frequency in the millimeter-, submillimeter-wave and terahertz ranges.

The chip has two or more multiplying or mixing structures, each of these individual structures consisting of a series of Schottky diodes operating at a certain frequency band with a given RF frequency bandwidth. The combination of these structures operate together as a single multiplier or mixer structure operating as a frequency multiplier or mixer with RF bandwidth equal to the sum of the individual RF bandwidths of each structure.

In various examples, the two or more multiplying structures are preferably fabricated together on a single substrate to guarantee a good alignment during assembly and therefore a better electrical performance of the on-chip diplexed multiplier or mixer.

In one example of on-chip diplexed multipliers, each of the multiplier structures can be designed to work either as a frequency doubler or frequency tripler, which allows to customize and adapt the on-chip diplexed multiplier design to a number of possible output RF frequency bands given a certain available RF input signal.

In one or more embodiments, the device includes a multiplier or mixer device, comprising a waveguide block comprising an input waveguide and output waveguides, wherein the input waveguide guides an input signal/wave received from a source; and a chip connected to the input waveguide, the chip comprising a novel implementation of two or more multiplying or mixer structures. Each of the multiplying structures include an input E-probe structured for receiving a selected part of the RF input signal, the input signal from the input waveguide, two or more Schottky diodes, and one or more stripline based input matching networks structured to transmit the input signal from the input E-probe to the two or more Schottky diodes, to generate an output signal two or three times the frequency of the input signal (for multiplier devices) or the difference of two input signals (LO and RF frequencies) using the non-linear properties of the Schottky diodes.

In one or more examples, each of the multiplier or mixer structures can further comprise one or more stripline based output matching networks structured for transmitting the output from each of the Schottky diodes to an output probe (that is included in the chip). The output probe transmits the multiplier or mixer output, comprising the combination of the output power generated in each of the Schottky diodes, off the single chip and into one the output waveguide.

In various examples, each of the multiplier structures can include metal direct current (DC) bias lines for biasing the Schottky diodes to optimize the device performance. The bias line is also used for tuning slightly the frequency bands generated for each multiplying structure to avoid gaps in the resultant combined on-chip diplexed signal once the signals generated by each multiplied or mixer structure are combined. In various examples, a total thickness of the chip, including the metal DC bias lines and the substrate for the chip, can be in a range of 1 micrometers to 100 micrometers. The chip can include one or more pairs of the Schottky diodes in a balanced configuration per multiplying or mixing structure.

The waveguide block can consist essentially of any metal, gold plated or not, that ensures a good electrical conductivity at the frequency of operation (e.g., aluminum, copper or gold-plated brass).

In various examples, the input source can include a frequency synthesizer followed by an amplifier and/or other frequency multiplying structures outputting the frequency in a range of 23-5000 (GHz). A coax to waveguide transition can be used for transmitting the input signal from the amplifier to the input waveguide for devices <200 GHz. For on-chip power combined devices >150 GHz, the input signal is usually coupled through waveguide-based structures. For high frequencies, that input signal can be also coupled quasi-optically using feed horn antennas.

In various examples, the GaAs heterostructure and the chip's geometry can be optimized such that the device can handle an input signal with an RF bandwidth greater than 30% and divide it into two or more multiplying or mixing structures. For example, the unique chip designs according to one or more embodiments of the invention can produce a continuous output signal between 205 and 300 GHz from an input signal between 65-100 GHz by utilizing two on-chip duplexing structures, one that couples only the 65-82 GHz part of the input signal and produces a ×3 multiplied output signal of 205-246 GHz, the second one that couples the 83 GHz to 100 GHz signal and produces an ×3 multiplied output signal of 249-300 GHz. These two subbands are combined together by two output probes, each of them connected to each multiplying structure, radiating into a common output waveguide. The total RF bandwidth of this 205-300 GHz on-chip diplexed multiplier is then ~40%, twice the bandwidth of the individual multiplying structures.

Prior to the present disclosure, high-efficiency frequency multipliers or mixers at these frequency bands exhibited RF operation bandwidths <30%, and typically 5-15%. Thus, one or more embodiments of the invention can provide a factor of up to 3 improvement in RF operation bandwidth compared to traditional single-chip Schottky diode based frequency multipliers and mixers.

The multiplier device can be used directly as a transmitter when connected to an external output antenna (e.g. horn antenna), as the local oscillator for an array of heterodyne receivers connected to the local oscillator, or as a driver stage for higher frequency sources. The mixer device can be used as a receiver when connected to a local oscillator source, to an IF microwave circuit, and to an external output antenna (e.g. horn antenna).

Several on-chip diplexed structures can be used in cascade to achieve higher orders of multiplication. As an example, the on-chip diplexed structures in the 150-240 GHz range, 400-600 GHz range and 1400 to 2100 GHz range can be used together to produce a 1400 GHz to 210 GHz receiver from an input signal at 70-86 GHz.

BRIEF DESCRIPTION OF THE DRAWINGS

Referring now to the drawings in which like reference numbers represent corresponding parts throughout:

FIG. 1B illustrates a Schottky diode according to one or more examples used herein.

FIG. 2A illustrates a second example of a 150-230 GHz on-chip diplexed frequency multiplier device designed and fabricated at JPL. This chip consists of one 150-172 GHz doubler structure and a 210-230 GHz frequency tripler structure to generate a broadband multiplier that produces these two band from a single input signal from 70-86 GHz

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Leveraging on the Jet Propulsion Laboratory's state-of-the-art Schottky diode process developed for the local oscillators in Herschel, the inventors have developed in the last decades broadband high-performance frequency multipliers and mixers operating in the 80 GHz to 5000 GHz frequency range with RF operations bandwidths of up to 20% with single Monolithic Microwave Integrated Circuit (MMIC) devices.

The solution, according to one or more embodiments of the invention, incorporates a novel topology called 'on-chip diplexing' that increases by a factor of two or more, the operational RF bandwidth of traditional frequency multipliers and mixers, without the need of combining several discrete chips using waveguide diplexers. The epi-structure and anode size of the tripler devices have been thoroughly optimized to get maximum performance in terms of power-handling and efficiency at these frequency bands. In terms of efficiency and output power, state-of-the-art results can be found in [5].

First Example Device

Figure 1A:
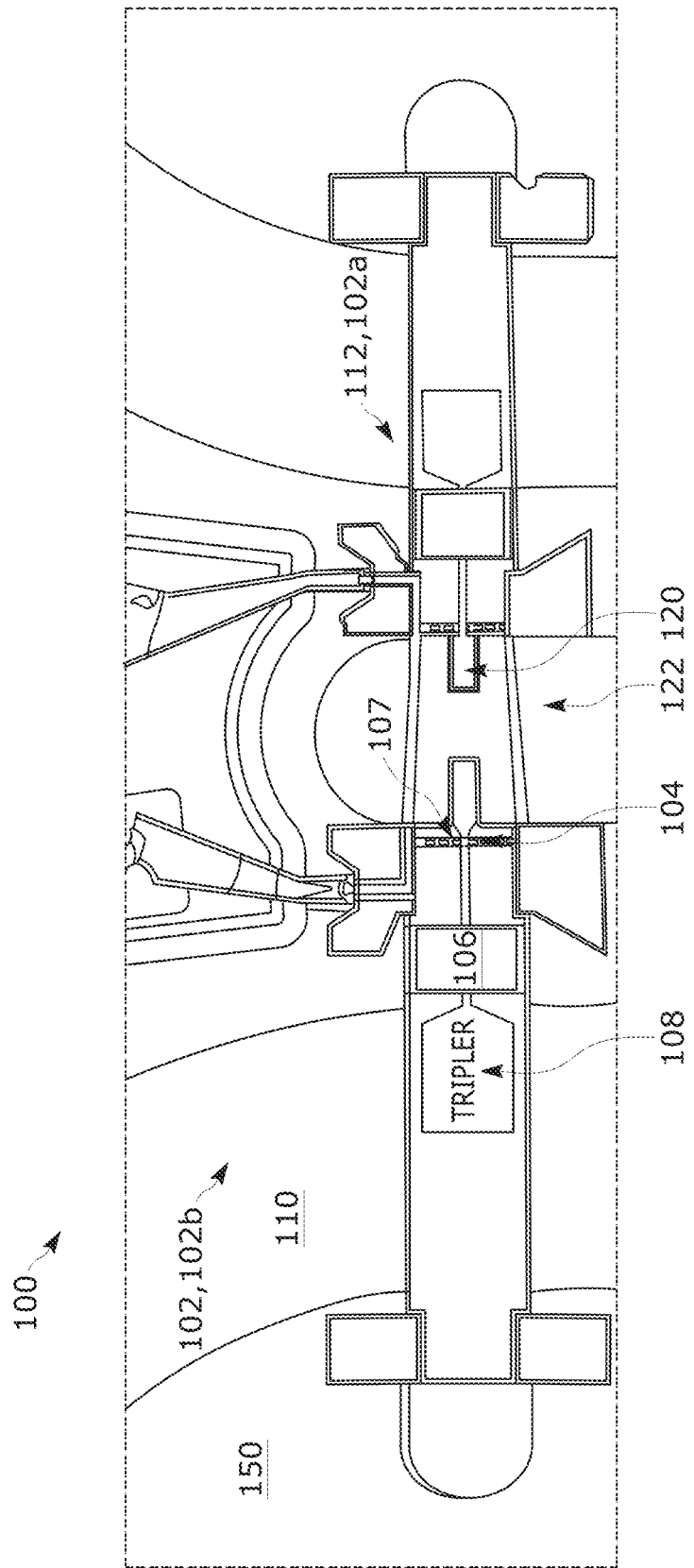
FIG. 1A is a photograph of an on-chip diplexed 210-300 GHz frequency tripler, completely designed at JPL and fabricated at the MicroDevices Laboratory at the Jet Propulsion Laboratory (JPL) according to a first example of the invention. This design can be scaled and modified to operate in any range in the 70-5000 GHz range.

FIG. 1A illustrates an example of a 200-300 GHz om-chip diplexed frequency multiplier device designed and fabricated at JPL. This chip consists of two frequency tripler structures (210-255 GHz and 255-300 Ghz) to generate a broadband multiplier with a total RF bandwidth of 210-300 GHz.

As illustrated in FIG. 1A, the multiplier or mixer solid-state device 100 comprises two or more on-chip diplexed frequency multipliers or mixer structures 102 (102a, 102b) including diodes 104, transmission lines 106, 107, chip to waveguide transitions (e.g. E-probes 108) and the waveguide structure 110 where the multiplier or mixer structures are placed. The on-chip duplexing distributes a broadband input signal, transmitted onto the chip 112, among the two or more multiplier or mixing structures with narrower RF operation bandwidth. Each multiplying or mixer structure 102a, 102b comprises two or more diodes 104 and is tuned to work in a certain frequency band, which is a sub-band of the input signal frequency band.

As illustrated in FIG. 1A, the on-chip distribution includes input E-probes 108 structured each for receiving one of the subbands of the input signal, the transmission lines 106 comprising one or more stripline based input matching networks structured to transmit the input signal, from the input E-probe(s) 108 to the two or more Schottky diodes 104. Using their nonlinear properties, the Schottky diodes generate output power having (1) an output signal a multiple (e.g., two or three times) the input frequency, or (2) mixing products of two different input signals.

FIG. 1A further illustrates the on-chip power output diplexing includes the transmission lines comprising 107 one or more stripline based output matching networks structured for transmitting the output signal from each of the Schottky diodes on each frequency multiplied/mixing structure to the output E-probes 120. The output E-probes are structured for transmitting the output signals at different frequency bands into one or more output waveguides 122. If the E-probes are located in a single output waveguide, the two or more signals are combined to generate a total output signal with the operation bandwidth the sum of the individual signals.

FIG. 1B illustrates the diodes 104 each comprise at least one anode 124, one ohmic contact 126 and a semiconductor heterostructure 128. The diodes on each structure are balanced in terms of electrical behavior. Together with the on-chip power diplexing, the chip has increased performance because the diodes' anodes, being micro-fabricated simultaneously on the same patch of a GaAs wafer under identical conditions, are very well balanced. The diodes' GaAs heterostructure and the overall chip geometry can be designed to be optimized for any power operation and any frequency operation between 50-5000 GHz. As a result of all these features, the device can still achieve a two to three times larger bandwidth without compromising performance (conversion efficiency or power handling capabilities) with respect to traditional designs.

Compared to traditional waveguide diplexing techniques [11], the electrical balance and symmetry of this circuit relies more on the superior accuracy of the lithographic fabrication of the MIMIC chip rather than on the accuracy of manually assembling multiple devices, especially at higher frequencies. This considerably reduces waveguide losses derived from using unnecessary waveguide structures, eliminates losses due to electrical asymmetries between chips when several discrete chips are power-combined, and simplifies significantly the component assembly [5].

Figure 1C:
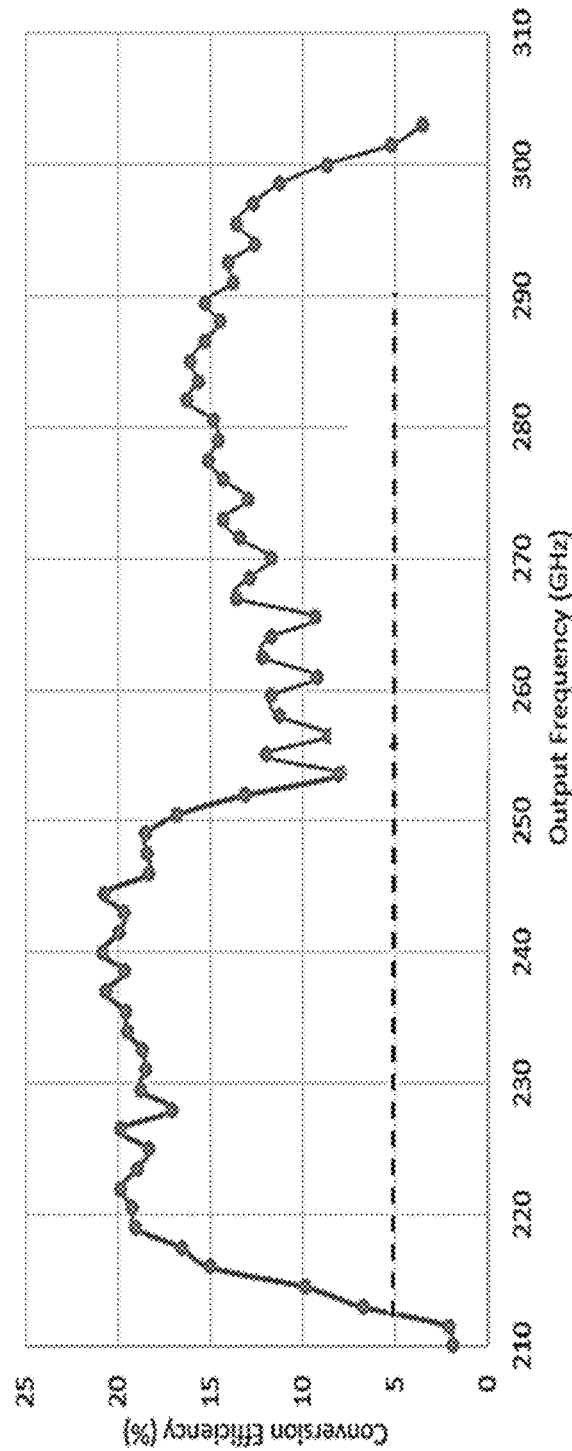
FIG. 1C is the measured performance of the device shown in FIG. 1A, showing a continuous RF bandwidth between 210 and 300 GHz.

FIG. 1C plots conversion efficiency of the diplexer 100 of FIG. 1A.

Second Example Device

Figure 2B:
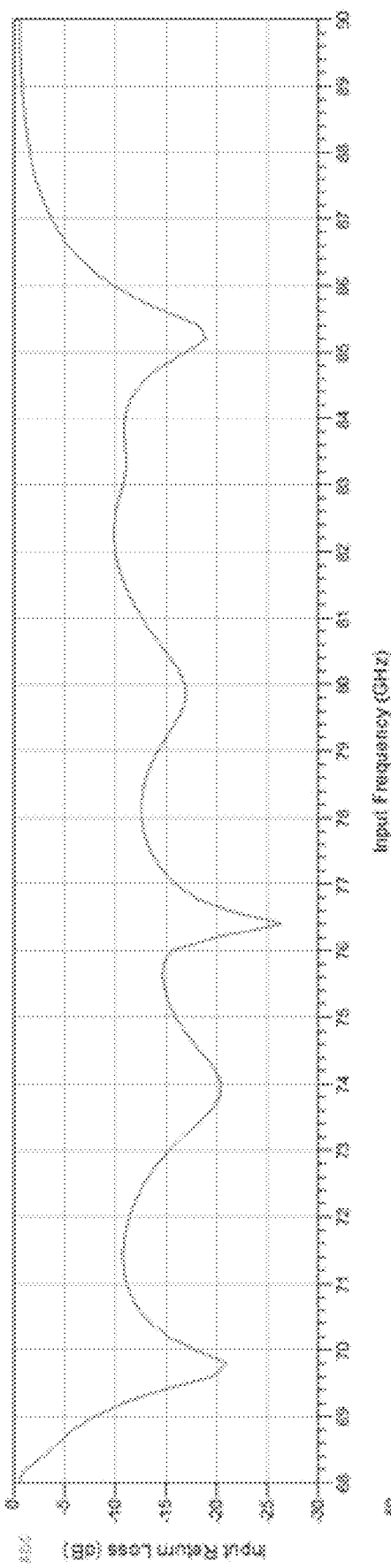
FIGS. 2B-2D illustrate simulated performance of the design illustrated in FIG. 2A, plotting input return loss (FIG. 2B), conversion efficiency as a function of input frequency (FIG. 2C), conversion efficiency as a function of output frequency (FIG. 2D).
Figure 2C:
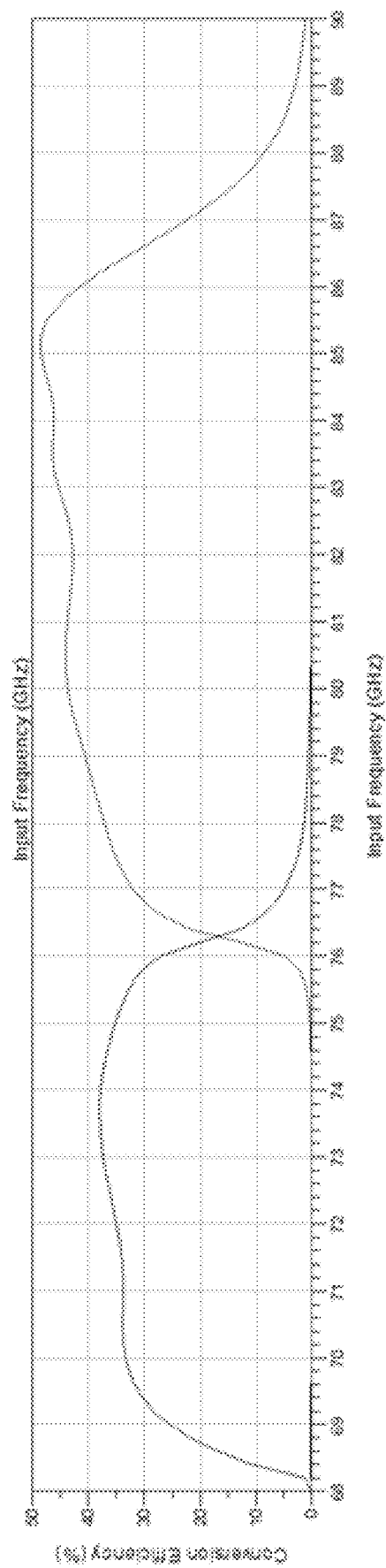
Figure 2D:
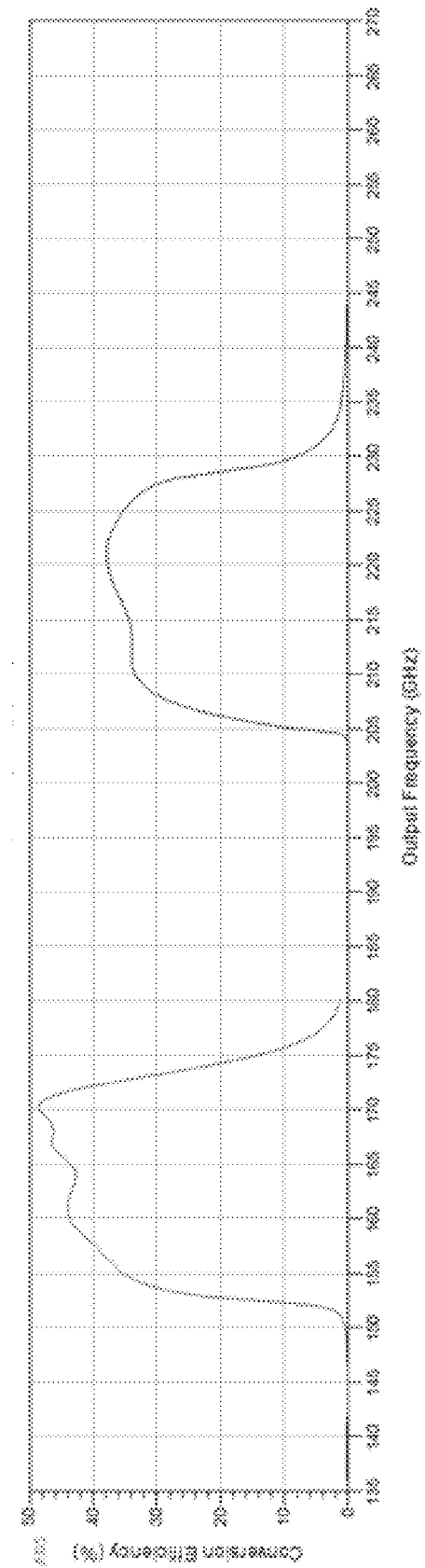
Figures 3A, 3B:
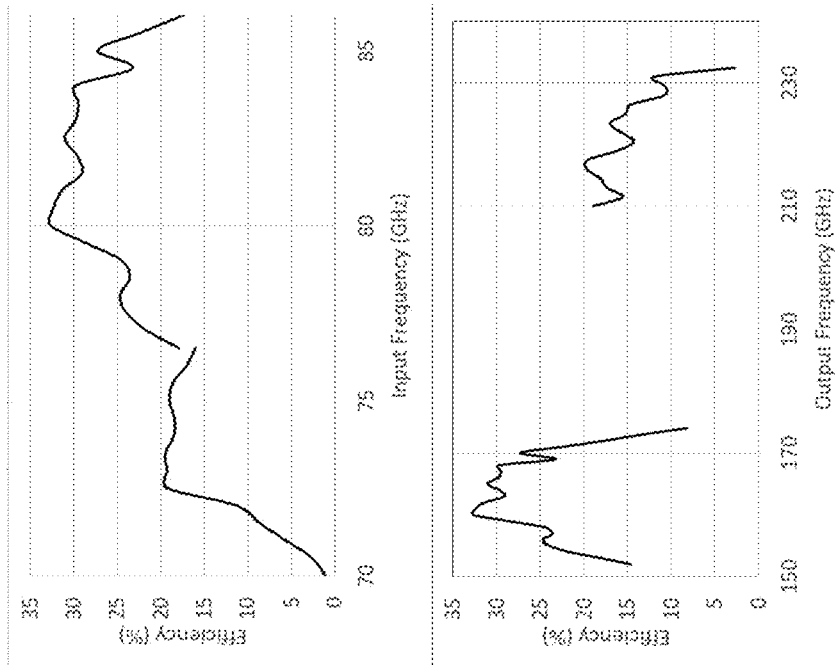
FIGS. 3A and 3B plot measured performance of the design illustrated in FIG. 2A, plotting efficiency as a function of input frequency (FIG. 3A) and efficiency as a function of output frequency (FIG. 3B).

FIG. 2A illustrates the typical topology of a 150-230 GHz on-chip diplexed frequency multiplier device designed at JPL., where the left part of the chip works as a doubler and the right part as a tripler. Thus, this chip consists of one 150-172 GHz doubler structure 102a and a 210-230 GHz frequency tripler 102b structure to generate a broadband multiplier that produces these two bands from a single input signal from 70-86 GHz. FIG. 2B plots the simulated performance of the device illustrated in FIG. 2A. The measured performance of a device fabricated based on this topology is shown in FIGS. 3A and 3B

Third Example: LO Performance

Figure 4:
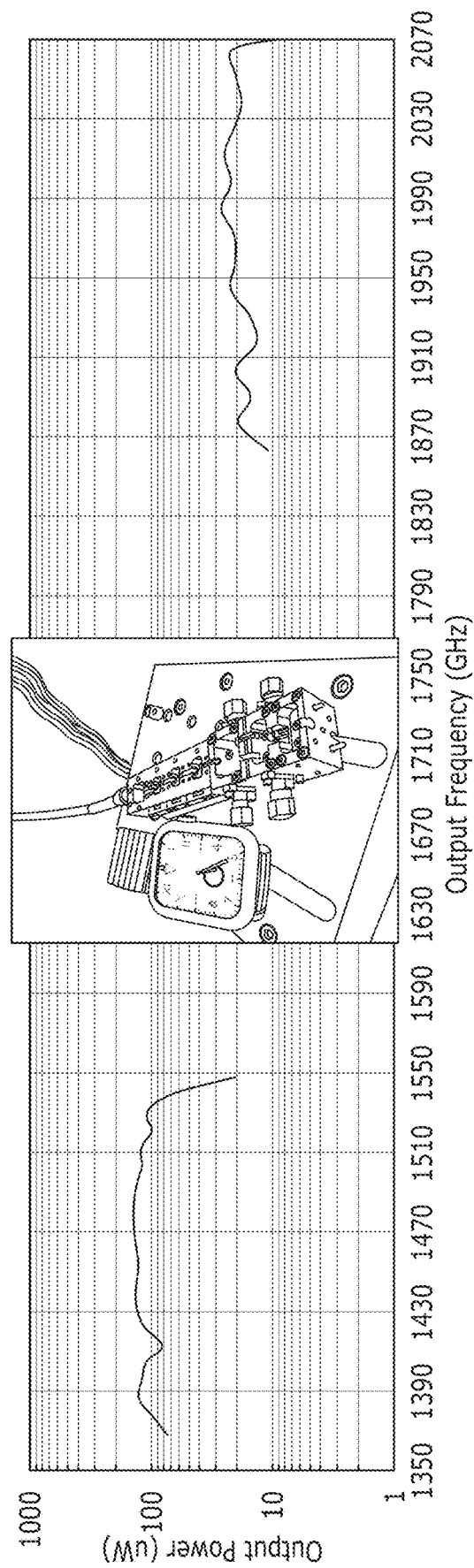
FIG. 4 illustrates performance of a 1300-2070 GHz frequency multiplied LO sourced consisting of three cascaded on-chip diplexed multiplier stages.

FIG. 4 illustrates performance of a 1300-2070 GHz frequency multiplied LO sourced consisting of three cascaded on-chip diplexed multiplier stages.

Figures 5A, 5B:
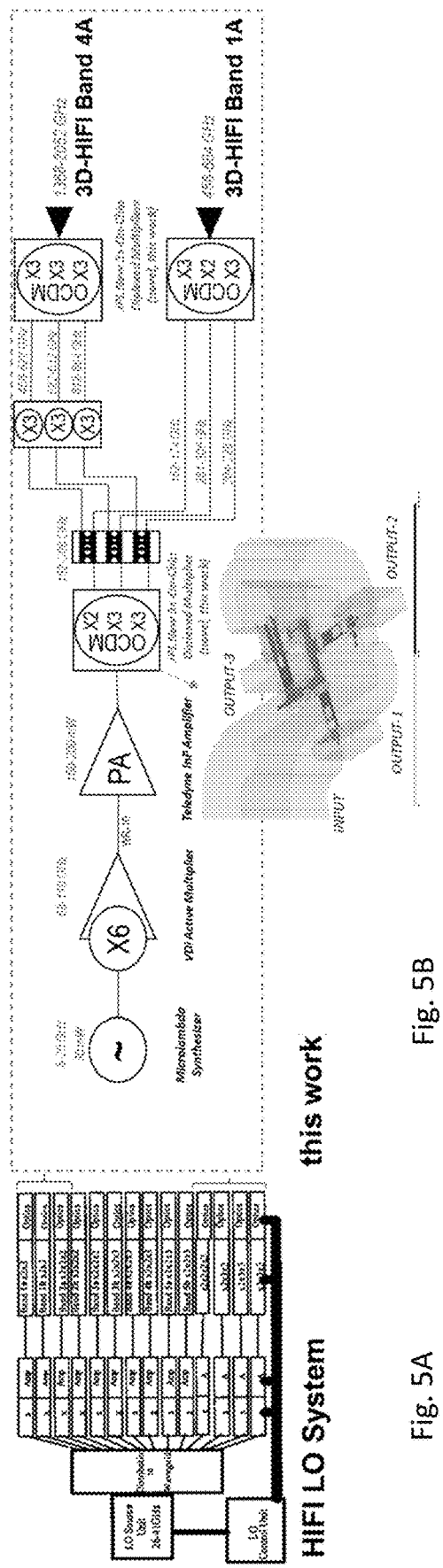
FIGS. 5A-5B illustrate a comparison of the HIFI LO Subsystem (FIG. 5A) and an enhanced LO channel using the on-chip duplexing technique (OCDM) according to embodiments described herein (FIG. 5B).

FIG. 5A and FIG. 5B illustrates using the on-chip-diplexed multiplier approach (OCDM) to reduce the complexity of multi-band transmitter and receivers, according to embodiments described herein the LO bandwidth can be improved by a factor of two or more, from ~10-15% up to 40% (or beyond). This ~40% bandwidth actually represents the limit for waveguide-based sources (full waveguide band monomodal operation). Examples of OCDM multiplier chips are shown in FIG. 5B.

Process Steps

Figure 6:
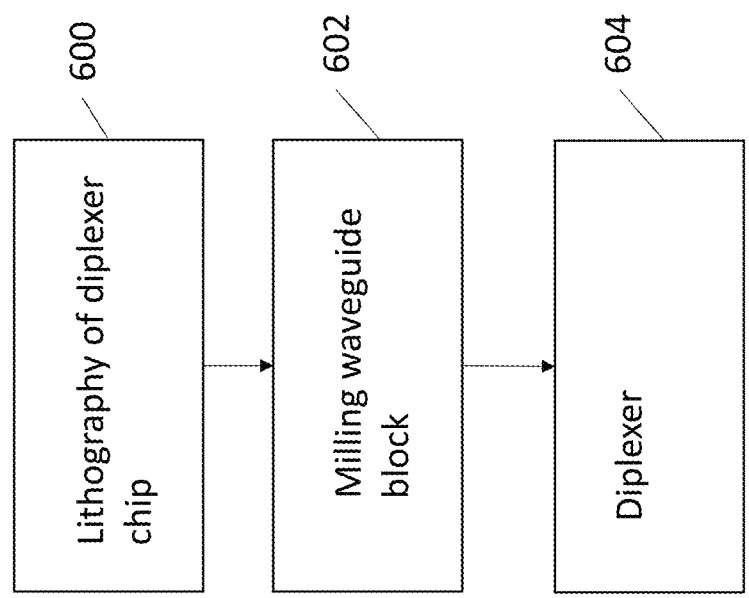
FIG. 6 is a flowchart illustrating a method of fabricating a diplexer device, according to one or more embodiments of the invention.

FIG. 6 is a flowchart illustrating a method of making a device according to embodiments described herein.

Block 600 represents fabricating (e.g., using lithography) an on-chip diplexed chip comprising two or more multiplying or mixing structures 102a, 102b. Each of the multiplying structures include two or more Schottky diodes 104, on-chip distribution including an input E-probe 108 structured each for receiving a sub-band of the input signal and one or more stripline based input matching networks structured to transmit an input signal, from the input E-probe(s) to the two or more Schottky diodes. In one or more examples, the output power generated by the diodes from the input signal has an output signal two or three times the input frequency of the sub-band of the input signal (or mixing products of two different input signals in the sub-band) using the nonlinear properties of the Schottky diodes.

The fabricating further comprises fabricating on-chip power output diplexing including an output E-probe 120, one or more stripline based output matching networks 107 structured for transmitting the output signal from each of the Schottky diodes on each frequency multiplied/mixing structure to the output E-probe. The output E-probes 120 are structured for transmitting the output signals at different frequency bands into one or more output waveguides.

Block 602 represents CNC (computer numerical control) milling of the waveguides and coupling the chip to the waveguides or any other waveguide block fabricating technique, such as plated silicon-micromachined waveguides.

Block 604 represents the end result, a diplexer device comprising multiplying or mixing structures. The device can be embodied in many ways including, but not limited to, the following (referring also to FIGS. 1A, 2A).

1. A multiplier or mixer solid-state device 100, comprising:
a chip comprising two or more on-chip diplexed frequency multipliers or mixer structures 102a, 102b including diodes 104, transmission lines 106,107, chip to waveguide transitions 108, and a waveguide structure 110 where the multiplier or mixer structures are placed, wherein:
the structures include on-chip diplexing distributing a broadband input signal, transmitted onto the chip, among the two or more of the multiplier or mixing structures with narrower RF operation bandwidth,
each multiplying or mixer structure comprises two or more diodes and is tuned to work in a certain frequency band, comprising a frequency sub-band of the broadband input signal's frequency band,
the diodes each comprise at least one anode, one ohmic contact and a semiconductor heterostructure,
the diodes on each structure are balanced in terms of electrical behavior,
the diodes each generate a higher frequency through frequency-multiplication of the input frequency in the frequency sub-band transmitted to the each of the diodes, or an intermediate frequency through frequency mixing of two input frequencies in the frequency sub-band transmitted to the each of the diodes,
each of the signals generated in the diodes of one of the multiplying or mixing structures are electrically combined to form an output signal comprising a combined output frequency band,
each of the output signals generated in each of the multiplying or mixing structures can be coupled to the same or different waveguides using E-probes 120 located on each structure radiating directly to the output waveguide(s), and
each of the two or more multiplying structures work at a different one of the frequency sub-bands within the input signal's frequency band, so that the input signal is automatically divided into the two or more multiplying structures without the need of additional waveguide-based diplexers.

2. The device of example 1, further comprising two or more input waveguides 110 transmitting comprising the broadband input signal comprising different input signals in two or more frequency bands, wherein:
the input waveguides are coupled together on a single one of the devices using on-chip E-probes connected to the two or more multiplying or mixer structures,
each of the two or more frequency bands are multiplied or mixed in a different one of the multiplying or mixer structures and the output signals are combined into a single output signal using output E-probes radiating into a single waveguide.

3. The device of example 1 or 2, wherein the semiconductor heterostructures and the chip's geometry are optimized such that each of the two or more multiplier or mixer structures work in a frequency band of ~10-30% of any range in 50-5000 GHz 4. The device of any of the examples 1-3, wherein the semiconductor heterostructure and the chip's geometry are such that each of the diodes can handle from a few microwatts to several watts of power of the input signal depending the application and frequency of operation.

5. The device of any of the examples 1-4, wherein:
for the two or more structures designed to work as a multiplier the diodes can be designed to multiply the input signal by a factor or two or more in frequency,
for the two or more structures designed to work as a mixer the diodes can be designed to combine the broadband input signal comprising two input signals to generate a third signal as a combination of two input signals or harmonics of the input signals,
each of the structures is designed to work in a different one of the frequency sub-bands,
the device can receive the broadband input signal comprising input signals from two or more different waveguides (with different frequency bands), multiply the input signals or mix the input signals using the nonlinear properties of the semiconductor diodes, and produce the combined output signal with a radio frequency (RF) bandwidth resulting from the addition of the individual input bandwidths of the input signals after mixing or multiplication in the diodes, and/or
the device can receive broadband input signal comprising one broadband input signal, distribute the broadband input signal on-chip (using the on-chip duplexing) among the two or more multiplying or mixer structures within a single device, and produce either one combined output or three separate outputs, each of the outputs with a different RF bandwidth of operation, the on-chip diplexing comprises input E-probes and the transmission lines comprise:
one or more stripline based input matching networks 106, 107 are structured to transmit: the input/output signals from/to the input E-probe to/from the two or more Schottky diodes on each multiplying/mixing structure, to generate the frequency multiplied or mixed signal using the nonlinear properties of the Schottky diodes, and
the input/output E-probe 108, 120 of each multiplying/mixing structure is structured for coupling from/to a waveguide the sum of the output powers generated in each of the Schottky diodes on each multiplying structures, and
the two or more probes 120 radiating different frequency bands into one input waveguide 110 and/or one output waveguide 122 are spatially separated with waveguide sections in between to optimize the coupling to each probe.

6. The device of any of the examples 1-5, wherein, each multiplying structure in the device can multiply the input signal by a different multiplication factor. In one example, an input signal comprising a 70-88 GHz signal can be coupled to an on-chip power combined multiplier consisting of two multiplying structures, one tripling the 70-76 GHz signal to 210-228 GHz, and another one doubling the 76 GHz to 88 GHz signal to 152-176 GHz.

7. The device of any of the examples 1-6, wherein each mixing structure can work either as a fundamental balanced mixer or a subharmonic mixer.

8. The device of any of the examples 1-7, further comprising one or more housing waveguide blocks fabricated out of metal or plated silicon, the housing waveguide blocks housing the waveguides and the device.

9. A plurality of the devices of any of the examples 1-8, designed for operation at different frequency bands, wherein the devices are cascaded to produce higher order on-chip frequency multiplier devices.

10. The device or method of any of the examples 1-9 wherein the E-probes 120 are located in the output waveguides 110 comprising a single output waveguide, the two or more output signals are combined to generate a total output signal with the operation bandwidth the sum of the individual output signals.

11. The device or method of any of the examples 1-10, further comprising milling the waveguides into a metal block 150 or silicon block.

12. The device or method of any of the examples 1-11, further comprising selecting the semiconductor heterostructure of the diodes and the chip's geometry such that the chip produces the highest possible performance (both conversion efficiency and bandwidth).

13. A method of fabricating the device using a combination of lithography and CNC machining and comprising:
fabricating an on-chip diplexed chip comprising two or more multiplying or mixing structures, wherein each of the multiplying structures include:
two or more Schottky diodes,
on-chip diplexing distribution including an input E-probe structured each for receiving a sub-band of the input signal,
one or more stripline based input matching networks structured to transmit an input signal, from the input E-probe attached to the multiplying structure to the two or more Schottky diodes, to generate output power having an output signal two or three times the input frequency of the sub-band of the input signal (or mixing products of two different input signals in the sub-band) using the nonlinear properties of the Schottky diodes,
on-chip power output diplexing including an output E-probe, one or more stripline based output matching networks structured for transmitting the output signal from each of the Schottky diodes on each frequency multiplied/mixing structure to the output waveguide, and
wherein the two or more output E-probes (one per multiplying or mixing structures) are designed for transmitting the output signals at different frequency bands into one or more output waveguides.

14. The device of any of the examples 1-12, fabricated according to the method of example 13.

15. The method of example 13 or 14, wherein two or more E-probes of the on-chip duplexing multiplier or mixer are located in a single input waveguide and the two or more output signals with different frequency bands are either combined into a single waveguide using two or more output E-probes radiating into the same output waveguide (to generate a total output signal with the operation bandwidth the sum of the individual output signals), or radiated into different waveguides with each output E-probe radiating to a different output waveguide.

16. The method of example 13 or 14, wherein:
the input signal of two or more input waveguides is captured by two or more input E-probes located each inside one of these input waveguides, and
the two or more output signals with different frequency bands are either combined into a single waveguide using two or more output E-probes radiating into the same output waveguide (to generate a total output signal with the operation bandwidth the sum of the individual output signals), or radiated into different waveguides with each output E-probe radiating to a different output waveguide.

17. The method or device of any of the examples 1-16, further comprising milling the waveguides into a metal block or silicon block.

18. The method or device of any of the examples 1-17, further comprising selecting the semiconductor heterostructure of the diodes and the chip's geometry such that the chip produces the highest possible performance (both conversion efficiency and bandwidth).

19. A solid state device, comprising:
a chip comprising on-chip diplexing distributing an input signal transmitted onto the chip into two or more structures 102a, 102b, each of the structures comprising a multiplier structure or a mixing structure receiving a different part of the input signal comprising a different frequency band in the input signal, the multiplier structure or the mixer structure comprising:
a plurality of Schottky diodes 104 each generating a higher frequency output through frequency-multiplication of the frequency band or frequency mixing of the frequency band, and
the higher frequency outputs are combined to form a combined output signal.

20. The device of claim 19, wherein the multiplier structure or the mixer structure further comprises:
an input E-probe 108 structured for receiving the part of the input signal comprising one the frequency band;

one or more stripline based input matching networks 106 structured to transmit the part of the input signal from the input E-probe to each of the Schottky diodes; and one or more stripline based output matching networks 107 structured for transmitting the higher frequency output from each of the Schottky diodes to an output probe on the chip, the output probe 120 transmitting a combination of the higher frequency outputs generated in each of the Schottky diodes off the chip and into an output waveguide.

21. The device of claim 19 or 20, further comprising a waveguide block comprising an input waveguide and the output waveguide, wherein the input waveguide guides the input signal received from a source to the input E probe.

22. The device of claim 19, 20, or 21, wherein the source comprises a frequency synthesizer followed by an amplifier and/or other frequency multiplying structures outputting a frequency in a range of 23-5000 (GHz).

23. Several on-chip diplexed structures can be used in cascade to achieve higher orders of multiplication. As an example, the on-chip diplexed structures in the 150-240 GHz range, 400-600 GHz range and 1400 to 2100 GHz range can be used together to produce a 1400 GHz to 210 GHz receiver from an input signal at 70-86 GHz.

Example Applications

One or more embodiments of the invention can be used as a source or mixer as part of receivers for one or more of the following applications All-solid-state single-pixel high-resolution heterodyne receivers at submillimeter wavelengths have played a major role in astrophysics as well as in earth and planetary remote sensing. Missions such as ESA's Herschel Space Observatory (with NASA contribution) and NASA's Microwave Limb Sounder have further increased the scientific community's interest in submillimeter-wave spectroscopy. New requirements are now demanded by scientists for future NASA missions involving submillimeter-wave heterodyne instruments.

In Astrophysics, powered by the exceptional scientific findings from the HIFI instrument on-board Herschel Space Observatory [12], high-resolution (>1E6) submillimeter-wave receivers continue to be a key player among the core instruments intended to answer key questions on the Decadal Survey: How did we get here? How did our galaxy form? and How did our life-bearing planet form? NASA's Astrophysics Roadmap in the next 3 decades recognized the need for an Origins Space Telescope mission with enhanced measurement capabilities relative to those of the Herschel. Origins Space Telescope (OST), one of the four Science and Technology Definition Study (STDT) selected by NASA HQ for the 2020 Astronomy and Astrophysics Decadal survey, might include a heterodyne instrument (HERO) [13]. HERO can be seen as a very ambitious upgrade of HIFI, featuring very large focal plane arrays (>64 pixels) covering an extremely wide frequency range from 468 to 2700 GHz (641 to 111 microns) in only 5 bands. A key science driver for HERO is tracing the path of water from interstellar clouds to habitable planets in order to understand how they came to have significant water to enable life. This also requires a deep understanding of the evolution of the interstellar medium (ISM) and how star formation is regulated in galaxies. Stars form in cores, which condense from interstellar clouds, and thereby incorporate material from their placental core. Part of this material stays in the protoplanetary disk surrounding the new star and eventually forming planets and smaller objects. The process is regulated by stellar feedback, e.g. winds from massive stars and supernova explosions that reshape these clouds. These violent outbursts can, over millions of years, disperse the surrounding material and significantly impede star formation. Without this feedback, all the available gas and dust in galaxies like our own would have coalesced into stars long ago. The dynamics of the different gas components of the ISM have to be measured with exquisite precision. Wind-resolved observations require high-spectral resolution receivers tunable to each of the key tracers the govern these processes. For example, the trail of gaseous water can be studied by observing the emission and absorption lines of water and its isotopologues. The low-lying transitions (at 557, 1661, and 1670 GHz for ortho-H2 16O, 1113 and 988 GHz for para-H216O, 548 GHz for H2 18O, 552 GHz for H2 17O, and 509 and 894 GHz for HDO) are particularly important as they trace water in the cold, early phases of cloud and proto-stellar evolution. The [CII] line (1901 GHz; 158 μm) is a valuable tracer of the rate of star formation and of the evolution of interstellar atomic diffuse to dense molecular clouds in which new stars form. The fine structure lines of [NII] at 1461 and 2459 GHz (205 and 122 mm) are required to probe ionized regions and measure the electron density there. The HD line at 2675 GHz can be used to study the mass distribution of protoplanetary disks.

All-solid-state room-temperature multi-pixel submillimeter-wave receivers are also in high demand for efficient spatial mapping/remote sensing of a planet's atmosphere composition and wind velocities (e.g., for future NASA missions to Venus, Jupiter and its moons (e.g., Europa), etc).

High resolution ultra-broadband radar-transceivers operating at submillimeter waves can be used in orbit for sub-cm space debris detection or in the ground for terahertz imaging or humidity radars. One or more embodiments of the present invention's technology can also be applied to the implementation of very high-resolution imaging radars for stand-off detection of concealed weapons. For submillimeter-wave radar imaging, the main issue is that, in order to reach video frame rates with high image pixel density, multi-pixel focal plane transceiver arrays are needed to illuminate targets with many radar beams simultaneously. One or more embodiments of the present invention can be used as a source to illuminate targets with several radar beams simultaneously.

In addition, achieving ultra broadband operations in submillimeter-wave sources and receivers in the 100 GHz to 1000 GHz range (which can be achieved using multipliers and or mixers according to one or more embodiments of the invention) is very important for high-data rate submillimeter-wave communications for civil and military applications.

Advantages and Improvements

The main issue (for achieving the above described goals and applications) is to improve/increase the limited RF bandwidth of state-of-the-art GaAs Schottky diode technology used for the local oscillators (LO) and mixer in these heterodyne receivers. For future space missions, the goal should be to produce the first detailed and complete census of the ISM ecosystems in the Milky Way with the aim of understanding the evolution of the ISM phases and its relationship to star formation. Even if NASA's COBE found that 50% of the luminosity and 98% of the photons emitted since the big bang are in the submillimeter-wave range, large area surveys of key species at high spectral resolution (106, ~0.3 km/s) is still missing in this range. This is mostly due to the lack of broadband receivers, limiting the scope of each mission to a few lines and specific astronomical targets. The RF bandwidth per channel of state-of-the-art submillimeter-wave receivers is only ~15%, which limits the science return. With enhanced RF bandwidth, high-spectral resolution far-infrared instruments would be capable of tuning, for example, to all key tracers of star formation ([CII], [NIT], water, OI, HD, OH, HDO, HF, HD, CO, etc.). Hence, it is crucial for this field to increase the bandwidth of current receiver technology from ~12% to ~40% or beyond. A typical high-spectral resolution heterodyne receiver consists of an antenna, a frequency mixer, a Schottky diode-based frequency multiplied LO source, and the IF processor (including low noise amplifiers, filters, amplifiers and spectrometers). The bottleneck is the RF bandwidth of the LO (~15% only). Future missions will require continuous frequency coverage from 400 to 3000 GHz with only a few receivers. This requires bandwidths of ~40%. This invention allows to extend the bandwidth of current Schottky based submillimeter-wave sources and receivers beyond 30% and up to 50% to retire this limitation.

In particular, no commercially available high-broadband sources output beyond ~200 GHz with high enough power and RF bandwidth for most applications. One or more embodiments of the present invention can satisfy this need.

The inventors' group at the Jet Propulsion Laboratory (JPL) is the world leader in millimeter- and submillimeter-wave frequency multiplied LO sources based on GaAs Schottky diode technology. As disclosed herein, one or more embodiments of the present invention use a solution that incorporates a novel topology called "on-chip power-diplexing," that allows a factor of 2 or 3 increase in the RF bandwidth of traditional frequency multipliers and mixers. Moreover, the epi-structure and anode size of the devices has been, for the first time, optimized to reach performance limits of the GaAs Schottky diode technology (in terms of power-handling and efficiency at Ka-band, W-band, and F-band frequencies).

Thus, using one or more of the inventors' extensive experience in Schottky diode technology, one or more of the inventors' state-of-the-art Schottky micro-fabrication process established for the development of the local oscillators for the HIFI instrument on-board the Herschel Space Observatory, the novel on-chip power duplexing technique to boost up the RF bandwidth of traditional Schottky multipliers and mixers, and improved optimization methods based on physics-based modeling of the semiconductor devices, one or more embodiments of the invention disclose and produce ultra-high bandwidth high-performance Schottky diode based frequency multipliers and mixers with operating bandwidths up to 50% in any frequency subset of the 100-5000 GHz range. The frequency bandwidth of these frequency multipliers and mixers reaches the operational monomodal limit of waveguide bands and it is also similar to the state-of-the-art broadband amplifiers available <350 GHz [10]. Compared to currently available Schottky diode-based sources and receivers in the 200 GHz to 5000 GHz bandwidth. Thus, one or more embodiments of the invention provide a factor of 2 to 3 increase in the RF bandwidth of Schottky devices depending on the implemented configuration of the on-chip diplexed technique.

Conventional frequency multipliers outputting in the W-band or F-band, on the other In addition, one or more embodiments of the invention provide multipliers that not only compete, but also surpass the performance of amplifier-based solutions beyond 200 GHz. For example, one or more embodiments of the present invention can provide multiplier devices that are more compact, cheaper, and produce more power (from a single chip) than either GaAs-based amplifiers or GaN-based amplifiers. Indeed, devices according to one or more embodiments of the invention can operate in the 300 GHz range with 40% bandwidth, whereas commercially available broadband amplifiers do not operate beyond up to 300 GHz. Hence one or more embodiments of the present invention provide a solution that considerably reduces the cost of high-frequency broadband sources.

In addition, multipliers and mixers according to one or more embodiments of the invention can be flight qualified (e.g., robust).

REFERENCES

The following references are incorporated by reference herein.

[1] I. Mehdi, J. V. Siles, C. Lee and E. Schlecht, "THz Diode Technology: Status, Prospects, and Applications," in *Proceedings of the IEEE*, vol. 105, no. 6, pp. 990-1007, June 2017, doi: 10.1109/JPROC.2017.2650235.

[2] H. Song and T. Nagatsuma, "Present and Future of Terahertz Communications," *IEEE Trans. on THz. Sc. And Tech.*, Vol. 1, pp. 256-263, September 2011.

[3] I. F. Akyildiz, J. M. Jornet, C. Han, Terahertz band: next frontier for wireless communications, Phys. Commun. 12 (2014) 16-32.

[4] K. Cooper, et al., "THz Imaging Radar for Standoff Personnel Screening," *IEEE Trans. on THz. Sc. And Tech.*, Vol. 1, pp. 33-53, September 2011

[5] J. V. Siles, K. Cooper, C. Lee, et al., "A New Generation of Room-Temperature Frequency Multiplied Sources with up to 10× Higher Output Power in the 160 GHz-1.6 THz Range", Proc. of the IEEE Transactions of Space Terahertz Communications, November 2018

[6] HRL Laboratories LLC., http://mmics.hrl.com

[7] Millitech Inc., http://www.millitech.com

[8] R. Ferber, et al., "W Band MMIC Power Amplifiers for the Herschel HIFI Instrument," *Proc. of* 14*th Int. Symp. Space THz Tech.*, April 2003.

[9] V. Radisic, K. Leong, X. Mei, S. Sarkozy, W. Yoshida, P. Liu, J. Uyeda, R. Lai, W. Deal, Ä 50 mW 220 GHz Power Amplifier Module," *IEEE MTT-S Int. Microwave Symp. Dig.*, pp. 45-48, June 2010.

[10] http://www.teledyne-si.com/products/Documents/Teledyne_SSPA_brochure_Mar-2020.pdf

[11] D. Ammar and G. Clark, Waveguide diplexer, U.S. Patent US20070139135A1, 2005.

[12] de Graauw, T. et al, "The Herschel-Heterodyne Instrument for the Far-Infrared (HIFI)", Astronomy and Astrophysics, Volume 518, July 2010.

[13] Wiedner, M. et al, "A proposed Heterodyne Receiver for the Origins Space Telescope", IEEE Trans on THz. Sc. & Tech., Vol. 8, No. 6, November 2018.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A multiplier or mixer solid-state device, comprising:
a chip comprising two or more on-chip diplexed frequency multiplying or mixer structures including diodes, transmission lines, chip to waveguide transitions, and a waveguide structure where the multiplying or mixer structures are placed, wherein:

the structures include on-chip diplexing distributing a broadband input signal, transmitted onto the chip, among the two or more of the multiplier or mixing structures with narrower RF operation bandwidth, each of the multiplying or mixer structures comprises two or more diodes and is tuned to work in a certain frequency band, comprising a frequency sub-band of the broadband input signal's frequency band, the diodes each comprise at least one anode, one ohmic contact and a semiconductor heterostructure, the diodes on each of the structures are balanced in terms of electrical behavior, the diodes each generate a higher frequency through frequency-multiplication of the input frequency in the frequency sub-band transmitted to the each of the diodes, or an intermediate frequency through frequency mixing of two input frequencies in the frequency sub-band transmitted to the each of the diodes, each of the signals generated in the diodes of one of the multiplying or mixing structures are electrically combined to form an output signal comprising a combined output frequency band, each of the output signals generated in each of the multiplying or mixing structures can be coupled to the same or different output waveguide(s) using output E-probes located on each of the structures radiating directly to the same or different output waveguide(s), and each of the two or more multiplying structures work at a different one of the frequency sub-bands within the input signal's frequency band, so that the input signal is automatically divided into the two or more multiplying structures without the need of additional waveguide based diplexers.

2. The device of claim 1, further comprising two or more input waveguides transmitting the broadband input signal comprising different input signals in two or more frequency bands, wherein:

the input waveguides are coupled together on a single one of the devices using on-chip E-probes connected to the two or more multiplying or mixer structures, and each of the two or more frequency bands are multiplied or mixed in a different one of the multiplying or mixer structures and the output signals are combined into a single output signal using the output E-probes radiating into a single waveguide.

3. The device of claim 1 or 2, wherein the semiconductor heterostructures and the chip's geometry are optimized such that each of the two or more multiplying or mixer structures work in a frequency band of ~10-30% of any range within 50-5000 GHz.

4. The device of claim 3, wherein the semiconductor heterostructure and the chip's geometry are such that each of the diodes can handle from a few microwatts to several watts of power of the input signal depending the application and frequency of operation.

5. The device of claim 4, wherein:

for the two or more structures designed to work as a multiplier, the diodes can be designed to multiply the input signal by a factor or two or more in frequency, for the two or more structures designed to work as a mixer, the diodes can be designed to combine the broadband input signal comprising two input signals to generate a third signal as a combination of the two input signals or harmonics of the input signals, each of the structures is designed to work in a different one of the frequency sub-bands, the device can receive the broadband input signal comprising the input signals from two or more different waveguides (with different frequency bands), multiply the input signals or mix the input signals using the non-linear properties of the semiconductor diodes, and produce the combined output signal with a radio frequency (RF) bandwidth resulting from the addition of the individual input bandwidths of the input signals after mixing or multiplication in the diodes, and/or the device can receive the broadband input signal comprising one broadband input signal, distribute the broadband input signal on-chip (using the on-chip duplexing) among the two or more multiplying or mixer structures within a single device, and produce either one combined output or three separate outputs, each of the outputs with a different RF bandwidth of operation, the on-chip diplexing comprises input E-probes and the transmission lines comprise one or more stripline based input matching networks are structured to transmit: the input/output signals from/to the input/output E-probe to/from the diodes comprising two or more Schottky diodes on each multiplying/mixing structure, to generate the frequency multiplied or mixed signal using the nonlinear properties of the Schottky diodes, and the input/output E-probe of each multiplying/mixing structure is structured for coupling from/to a waveguide the sum of the output powers generated in each of the Schottky diodes on each multiplying structures, and the two or more E-probes radiating different frequency bands into one input waveguide and/or one output waveguide are spatially separated with waveguide sections in between to optimize the coupling to each probe.

6. The device of claim 5, wherein, each of the multiplying structures in the device can multiply the input signal by a different multiplication factor.

7. The device of claim 5, wherein each mixing structures can work either as a fundamental balanced mixer or a subharmonic mixer.

8. The device of claim 5, further comprising one or more housing waveguide blocks fabricated out of metal or plated silicon, the housing waveguide blocks housing the waveguides and the device.

9. A plurality of the devices of claim 8, designed for operation at different frequency bands, wherein the devices are cascaded to produce a plurality of higher order on-chip frequency multiplier devices.

10. A method of fabricating the device using a combination of lithography and CNC machining and comprising:

fabricating an on-chip diplexed chip comprising two or more multiplying or mixing structures, wherein each of the multiplying or mixing structures include:

two or more Schottky diodes, on-chip diplexing distribution including an input E-probe each structured for receiving a sub-band of an input signal, one or more stripline based input matching networks structured to transmit the input signal, from the input E-probe (attached to each of the multiplying or mixing structures) to the two or more Schottky diodes, to generate output power having an output signal two or three times the input frequency of the sub-band of the input signal (or mixing products of two different input signals in the sub-band) using the nonlinear properties of the Schottky diodes, on-chip power output diplexing including an output E-probe, one or more stripline based output matching networks structured for transmitting the output signal from each of the Schottky diodes on each of the multiplying or mixing structures to one or more output waveguides, and wherein the two or more output E-probes (one per multiplying or mixing structures) are designed for transmitting the output signals at different frequency bands into the one or more output waveguides.

11. The device of claim 5, fabricated according to the method of claim 10.

12. The method of claim 10, wherein two or more E-probes of the on-chip duplexing multiplying or mixer structures are located in a single input waveguide and the two or more output signals with different frequency bands are either combined into a single one of the output waveguides using two or more output E-probes radiating into the same one of the output waveguides (to generate a total output signal with the operation bandwidth the sum of the individual output signals), or radiated into the output waveguides comprising different waveguides with each output E-probe radiating to a different one of the output waveguides.

13. The method of claim 10, wherein:
the input signal of two or more input waveguides is captured by two or more of the input E-probes located each inside one of these input waveguides, and
the two or more output signals with different frequency bands are either combined into a single one of the output waveguides using two or more of the output E-probes radiating into the same one of the output waveguides (to generate a total output signal with the operation bandwidth the sum of the individual output signals), or radiated into the output waveguides comprising different waveguides with each output E-probe radiating to a different one of the output waveguides.

14. The method of claim 10, further comprising milling the waveguides into a metal block or silicon block.

15. The method of claim 10, further comprising selecting a semiconductor heterostructure of the diodes and the chip's geometry such that the chip produces the highest possible performance (both conversion efficiency and bandwidth).

16. A solid-state device, comprising:
a chip comprising on-chip diplexing distributing an input signal transmitted onto the chip into two or more structures, each of the structures comprising a multiplier structure or a mixing structure receiving a different part of the input signal comprising a different frequency band in the input signal, the multiplier structure or the mixer structure comprising:
a plurality of Schottky diodes each generating a higher frequency output through frequency-multiplication of the frequency band or frequency mixing of the frequency band, and
the higher frequency outputs are combined to form a combined output signal.

17. The device of claim 16, wherein the multiplier structure or the mixer structure further comprises:
an input E-probe structured for receiving the part of the input signal comprising the different frequency band;
one or more stripline based input matching networks structured to transmit the part of the input signal from the input E-probe to each of the Schottky diodes; and
one or more stripline based output matching networks structured for transmitting the higher frequency outputs from each of the Schottky diodes to an output probe on the chip, the output probe transmitting a combination of the higher frequency outputs generated in each of the Schottky diodes off the chip and into an output waveguide.

18. The device of claim 17, further comprising a waveguide block comprising an input waveguide and the output waveguide, wherein the input waveguide guides the input signal received from a source to the input E probe.

19. The device of claim 18, wherein the source comprises a frequency synthesizer followed by an amplifier and/or other frequency multiplying structures outputting a frequency in a range of 23-5000 (GHz).

* * * * *

UNITED STATES PATENT AND TRADEMARK OFFICE
CERTIFICATE OF CORRECTION

| | | |
|---|---|---|
| PATENT NO. | : 12,087,867 B2 | Page 1 of 1 |
| APPLICATION NO. | : 17/093305 | |
| DATED | : September 10, 2024 | |
| INVENTOR(S) | : Jose Vicente Siles Perez, Choonsup Lee and Robert H. Lin | |

It is certified that error appears in the above-identified patent and that said Letters Patent is hereby corrected as shown below:

On the Title Page

Item (72) Inventors:
Please delete "Alejandro Peralta, Pasadena, CA (US)"

Signed and Sealed this
Fourth Day of March, 2025

Coke Morgan Stewart
*Acting Director of the United States Patent and Trademark Office*